(12) United States Patent
Piazzon (10) Patent No.: US 12,021,489 B2
(45) Date of Patent: Jun. 25, 2024

(54) AMPLIFIER CIRCUIT FOR DRIVING ELECTRO-OPTICAL MODULATORS WITH REDUCED PROCESS, VOLTAGE AND TEMPERATURE (PVT) SENSITIVITY

(71) Applicant: HUAWEI TECHNOLOGIES CO., LTD., Guangdong (CN)

(72) Inventor: Luca Piazzon, Milan (IT)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 151 days.

(21) Appl. No.: 17/560,910

(22) Filed: Dec. 23, 2021

(65) Prior Publication Data
US 2022/0115992 A1    Apr. 14, 2022

Related U.S. Application Data

(63) Continuation of application No. PCT/EP2019/066771, filed on Jun. 25, 2019.

(51) Int. Cl.
  *H03F 1/42*  (2006.01)
  *H03F 3/60*  (2006.01)
  *H04B 10/50* (2013.01)

(52) U.S. Cl.
  CPC .............. *H03F 1/42* (2013.01); *H03F 3/605* (2013.01); *H04B 10/501* (2013.01); *H03F 2200/36* (2013.01)

(58) Field of Classification Search
  CPC ........ H03F 1/42; H03F 3/605; H03F 2200/36; H03F 2200/18; H03F 1/0261; H03F 1/18;
  (Continued)

(56) References Cited

U.S. PATENT DOCUMENTS

| | | | |
|---|---|---|---|
| 4,543,535 A | 9/1985 | Ayasli | |
| 5,365,197 A * | 11/1994 | Ikalainen | H03F 3/607 333/22 R |

(Continued)

OTHER PUBLICATIONS

Jinho Jeong et al.,"Monolithic distributed amplifier with active control schemes for optimum gain and group-delay flatness, bandwidth, and stability",Apr. 4, 2004,total:10pages.

(Continued)

*Primary Examiner* — Hieu P Nguyen
(74) *Attorney, Agent, or Firm* — HUAWEI TECHNOLOGIES CO., LTD.

(57) ABSTRACT

The present disclosure relates to the field of amplifier circuits (driver amplifiers) for electro-optical modulators, in particular for amplifying an electrical signal for driving electro-optical modulators, an amplifier circuit is proposed for amplifying a signal comprising a gain amplifier, a distributed amplifier, a resistor, and a current source, wherein the input of the distributed amplifier is electrically connected to the output of the gain amplifier; the resistor terminates the input of the distributed amplifier; and the current source is electrically connected in parallel to the resistor. A method of setting a bias voltage of such an amplifier circuit is also proposed. Furthermore, a transmitter, in particular an optical transmitter, comprising such an amplifier circuit and a system comprising such a transmitter and a signal source are also proposed.

16 Claims, 7 Drawing Sheets

(58) Field of Classification Search
CPC ........... H03F 1/30; H03F 3/08; H04B 10/501;
H04B 1/0458; H04B 2001/0408
USPC .................. 330/286, 124 R, 295, 53–54
See application file for complete search history.

(56) References Cited

U.S. PATENT DOCUMENTS

| | | |
|---|---|---|
| 2003/0184384 A1 | 10/2003 | Orr et al. |
| 2009/0231043 A1 | 9/2009 | Suzuki |
| 2009/0243718 A1 | 10/2009 | Bonthron |
| 2009/0273412 A1 | 11/2009 | Richards |
| 2011/0169571 A1* | 7/2011 | Nilsson .................. H03F 1/565 |
| | | 330/277 |
| 2014/0111279 A1* | 4/2014 | Brobston .............. H03F 1/0222 |
| | | 330/286 |

OTHER PUBLICATIONS

J.B. Beyer et al.,"MESFET Distributed Amplifier Design Guidelines", 3, Mar. 1984,total:8pages.
David Fritsche et al.,"A Trimmable Cascaded Distributed Amplifier With 1.6 THz Gain-Bandwidth Product",6,Nov. 2015,total:4pages.
Ho-Gyeong Yun et al., "Characteristics of a Driver Amplifier Integrated 40 GB/s EML Module",Mar. 13, 2022, total:6pages.

* cited by examiner

AMPLIFIER CIRCUIT FOR DRIVING ELECTRO-OPTICAL MODULATORS WITH REDUCED PROCESS, VOLTAGE AND TEMPERATURE (PVT) SENSITIVITY

CROSS-REFERENCE TO RELATED APPLICATIONS

This application is a continuation of International Application No. PCT/EP2019/066771, filed on Jun. 25, 2019. the disclosure of which is hereby incorporated by reference in its entirety as if reproduced in full.

TECHNICAL FIELD

The present disclosure relates to the field of amplifier circuits (driver amplifiers) for electro-optical modulators, in particular for amplifying an electrical signal for driving electro-optical modulators.

BACKGROUND

In most advanced solutions of transmitters for optical communications it is required that the amplifier circuit (driver amplifier) shows a matched output impedance. The reason for this is that the matched output impedance of the amplifier circuit absorbs reflections coming from interconnections and components between the amplifier circuit itself and the electro-optical modulator being driven by the amplifier circuit. Such interconnections and components are for example bonding wires, bonding pads, bias coils or beads, DC-block capacitors and feeding lines.

To this purpose, amplifier circuits for optical transmitters, also referred to as "driver amplifiers for optical transmitters", are generally realized by cascading a gain amplifier and a distributed amplifier, wherein the input of the distributed amplifier is electrically connected to the output of the gain amplifier. The distributed amplifier allows achieving a matched output impedance in a wideband range. Moreover, the gain amplifier allows to reach a target gain level.

SUMMARY

Embodiments of the invention aim to improve the conventional solution for countering a variation in the DC voltage VDD supplied to the amplifier circuit for biasing the gain amplifier of the amplifier circuit. It is an objective to provide an amplifier circuit (driver amplifier) with maximum gain/bandwidth product and reduced sensitivity to process, voltage and temperature variations. This is of interest in order to be able to simultaneously optimize the gain/bandwidth product and linearity of the amplifier circuit and, thus, to simultaneously maximize performance and yield of a product.

An object is achieved by embodiments provided in the enclosed independent claims. Advantageous implementations of the embodiments are further defined in the dependent claims.

In particular, embodiments of the invention are based on setting the bias voltage of an amplifier circuit comprising a cascaded gain amplifier and distributed amplifier, which is achieved with a resistor terminating the input of the distributed amplifier and a current source electrically connected in parallel to the resistor.

Thus, an amplifier circuit with a maximum gain/bandwidth product and reduced sensitivity to process, voltage and temperature variations (reduced process, voltage and temperature sensitivity/PVT sensitivity) is enabled.

A first aspect of the invention provides an amplifier circuit for amplifying a signal, wherein the amplifier circuit comprises a gain amplifier, a distributed amplifier, a resistor, and a current source where the input of the distributed amplifier is electrically connected to the output of the gain amplifier; the resistor terminates the input of the distributed amplifier; and the current source is electrically connected in parallel to the resistor.

In the amplifier circuit according to the first aspect a current source is connected in parallel to the resistor terminating the input of the distributed amplifier The resistor terminating the input of the distributed amplifier may also be referred to as "terminating resistor". In particular, the resistor is an input matching resistor terminating the input of the distributed amplifier.

As will be described in the following pages, the bandwidth and gain of the amplifier circuit as well as the bias voltage VA provided to the output of the gain amplifier are dependent on the value of the resistor.

Since the current source is electrically connected in parallel to the resistor, it may shunt the current flowing through the resistor and, thus, it may set the current flowing through the resistor. In particular, the current source reduces the current flowing through the resistor. As a result, in the amplifier circuit according to the first aspect the nominal bias voltage VA of the gain amplifier is higher compared to the nominal bias voltage VA of the gain amplifier of a conventional amplifier.

Consequently, in the amplifier circuit according to the first aspect there is more margin to the minimum bias voltage of the gain amplifier, resulting in lower sensitivity to process, voltage and temperature variations. With other words, the current source in the amplifier circuit increases the nominal bias voltage of the gain amplifier and, thus, there is more margin to the minimum bias voltage of the gain amplifier, resulting in lower sensitivity of the amplifier circuit to process, voltage and temperature variations.

As a result of the reduced sensitivity of the amplifier circuit according to the first aspect to process, voltage and temperature variations, it is possible to simultaneously optimize the gain/bandwidth product and linearity of the amplifier circuit and, thus, to simultaneously maximize performance and yield of a product.

Therefore, with the amplifier circuit according to the first aspect an amplifier circuit with a maximum gain/bandwidth product and reduced sensitivity to process, voltage and temperature variations may be provided.

The resistor may be configured to set bandwidth and gain of the amplifier circuit.

A DC voltage source may be electrically connected to the resistor for providing a bias current and a bias voltage to the output of the gain amplifier via the input of the distributed amplifier, and the current source is particularly configured to set the bias voltage by setting the current flowing from the DC voltage source through the resistor.

In particular, the current source is configured to set the current flowing through the resistor by shunting a part of the current provided by the DC voltage source. Particularly, the current source is configured to set the current flowing through the resistor to a value that is lower than the value of the current provided by the DC voltage source. Thus, the current source is particularly configured to reduce the voltage drop at the resistor.

Since the bias voltage (VA) of the gain amplifier is dependent on the voltage drop at the resistor, for instance "$(I_g-I_q)\cdot R_g$", the current source is configured to increase the bias voltage (VA) of the gain amplifier by reducing the current flowing through the resistor and, thus, by reducing the voltage drop at the resistor. This is advantageous because an increase in the bias voltage VA of the gain amplifier results in a higher margin to the minimum bias voltage of the gain amplifier, resulting in lower sensitivity of the amplifier circuit to process, voltage and temperature variations. That is, an increase in the bias voltage VA results in a higher margin to process, voltage and temperature variations.

Particularly, the current source has an impedance that is higher than the impedance of the resistor.

In particular, the current source behaves as a high impedance for the electrical signal that is to be amplified by the amplifier circuit. Therefore, the gain and bandwidth of the amplifier circuit are not dependent on the current source.

The current source in the amplifier circuit increases the bias voltage of the gain amplifier and, thus, there is more margin to the minimum bias voltage of the gain amplifier, resulting in lower sensitivity of the amplifier circuit to process, voltage and temperature variations. At the same time, the current source particularly behaves as a high impedance and, thus, does not have an influence on the gain and bandwidth of the amplifier circuit.

Further, the impedance of the current source is particularly dimensioned such that it does not substantially affect gain and bandwidth of the amplifier circuit.

That is, the impedance of the current source is particularly dimensioned such that the gain and bandwidth of the amplifier circuit are not dependent on the current source.

In an implementation form of the first aspect, the current source particularly comprises a transistor configured to set the current flowing through the resistor.

This provides an effective but low-cost solution for implementing the current source.

In particular, the transistor is configured to set the current flowing from the DC voltage source through the resistor such that at least one third of the bias current flows through the resistor.

Particularly, the transistor of the current source is a field-effect transistor, in particular a metal-oxide-semiconductor field-effect transistor, or a bipolar junction transistor.

According to a particular alternative, the transistor of the current source is particularly a field-effect transistor, wherein the source terminal and the gate terminal of the field-effect transistor are electrically connected to a terminal of the resistor that is electrically connected to the input of the distributed amplifier, and wherein the drain terminal is electrically connected to another terminal of the resistor, to which a DC voltage source can be electrically connected.

According to another particular alternative, the transistor of the current source is particularly a bipolar junction transistor, wherein the emitter terminal and the base terminal of the bipolar junction transistor are electrically connected to a terminal of the resistor that is electrically connected to the input of the distributed amplifier, and wherein the collector terminal is electrically connected to another terminal of the resistor, to which a DC voltage source can be electrically connected.

Particularly, the amplifier circuit is configured to be implemented in an integrated circuit, in particular in a Monolithic Microwave Integrated Circuit.

A second aspect of the invention provides a transmitter, in particular an optical transmitter, comprising an amplifier circuit according to the first aspect or any of its implementations forms, as described above. Particularly, the transmitter is a transmitter for optical communications.

In an implementation form of the second aspect, the transmitter particularly comprises an electro-optical modulator configured to generate an optical signal; wherein the electro-optical modulator is electrically connected to the output of the amplifier circuit, in particular to the output of the distributed amplifier of the amplifier circuit, and wherein the amplifier circuit is configured to amplify a signal in order to drive the electro-optical modulator. That is, in the transmitter the amplifier circuit is particularly configured to amplify an electrical signal for driving the electro-optical modulator.

A third aspect of the invention provides a system, comprising a transmitter according to the second aspect or any of its implementations forms, as described above, and a signal source electrically connected to the input of the amplifier circuit, in particular to the input of the gain amplifier of the amplifier circuit.

In particular, the signal source is configured to provide an electrical signal to the input of the amplifier circuit for driving an electro-optical modulator. Particularly the signal source is a digital source, in particular a high speed digital source.

In an implementation form of the third aspect, the system particularly comprises a DC voltage source electrically connected to the resistor terminating the input terminal of the distributed amplifier of the amplifier circuit. The DC voltage source is particularly connected to the resistor for providing a bias current and a bias voltage to the output of the gain amplifier of the amplifier circuit via the input of the distributed amplifier of the amplifier circuit.

A fourth aspect of the invention provides a method for setting a bias voltage of an amplifier circuit according to the first aspect or any of its implementations forms, as described above, wherein the method comprises: setting the current drawn by the current source of the amplifier circuit from a DC voltage source connected to the resistor of the amplifier circuit, in order to set the current flowing from the DC voltage source through the resistor and, thus, setting the bias voltage.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The aspects and implementation forms of the present disclosure will be explained in the following description of specific embodiments in relation to the enclosed drawings.

DETAILED DESCRIPTION OF EMBODIMENTS

The present disclosure relates to the field of amplifier circuits (driver amplifiers) for electro-optical modulators, in particular for amplifying an electrical signal for driving electro-optical modulators, especially used in transmitters for optical communications, and has the general purpose of realizing broadband amplifier circuits (broadband driver amplifiers) with optimum gain/bandwidth product and reduced sensitivity to process, voltage and temperature variations.

For the term "sensitivity to process, voltage and temperature variations" the term "process, voltage and temperature (PVT) sensitivity" may be used as a synonym. This aspect is of high interest in transmitters for optical communications, where a broadband amplifier circuit (broadband driver amplifier) is used to increase the level of a signal source, such as a high speed digital source, in order to supply enough power to properly drive an electro-optical modulator. To this end, the invention proposes an amplifier circuit for amplifying a signal and further proposes a method of setting a bias voltage of such an amplifier circuit. Furthermore, the invention also proposes a transmitter, in particular an optical transmitter, comprising such an amplifier circuit and finally proposes a system comprising such a transmitter and a signal source. The amplifier circuit may also be referred to as "driver amplifier".

Figure 6:
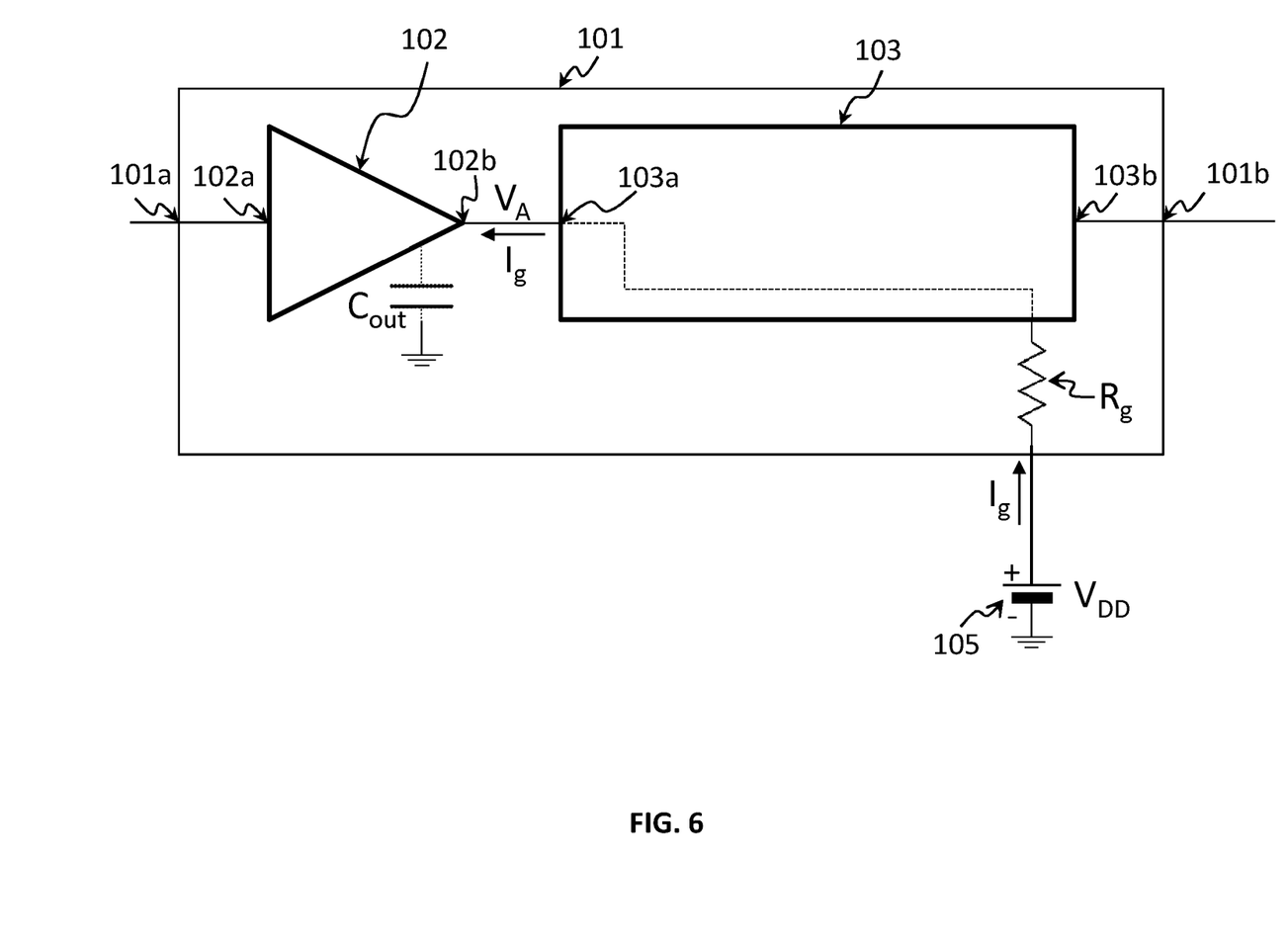
FIG. 6 shows an exemplary block diagram of an amplifier circuit comprising a gain amplifier and distributed amplifier that are cascaded.

FIG. 6 shows an exemplary block diagram of an amplifier circuit 101 comprising a gain amplifier 102 and a distributed amplifier 103 that are cascaded. The output 102b of the gain amplifier 102 is electrically connected to the input 103a of the distributed amplifier 103. The input 103a of the distributed amplifier is finally terminated on a resistor Rg. The resistor Rg may also be called "terminating resistor". To this resistor Rg a DC voltage source 105 providing a DC voltage VDD may be connected for providing a bias current Ig and a bias voltage VA to the output 102b of the gain amplifier 102 via the input 103a of the distributed amplifier 103. That is, the DC voltage VDD of the DC voltage source 105 is used for biasing the amplifier circuit 101, in particular for biasing the gain amplifier 102 of the amplifier circuit 101. The bias voltage VA at the output terminal 102b of the gain amplifier 102 depends on the DC voltage VDD and the resistor Rg. In FIG. 6 the input 102a of the gain amplifier 102 is connected to the input 101a of the amplifier circuit 101 and the output 103b of the distributed amplifier 103 is connected to the output 101b of the amplifier circuit 101. To the input 101a of the amplifier circuit 101 a signal source, such as a high speed digital source, and to the output 101b of the amplifier circuit 101 an electro-optical modulator may be connected. "Cout" represents the parasitic output capacitance of the gain amplifier 102.

In optical transmitters the input and output impedances of the amplifier circuit are generally specified at system level. In fact, the input impedance is defined by the signal source, such as a high speed digital source; while the output impedance is defined by the electro-optical modulator. As a consequence the gain/bandwidth product of the amplifier circuit can be optimized by properly choosing respectively optimizing the input resistance of the distributed amplifier and the parasitic output capacitance of the gain amplifier. However, due to the limited bias voltage, the optimum condition in terms of performance is generally more sensitive to process, voltage and temperature variations (PVT variations).

In this scenario, solutions that allow to obtain an amplifier circuit (driver amplifier) with maximum gain/bandwidth product and reduced sensitivity to process, voltage and temperature variations is of interest in order to simultaneously maximize performance and yield of a product.

In the following some considerations that laid the basis for embodiments of the present invention are elaborated. The bandwidth of an amplifier circuit used in a transmitter for optical communications is usually a specification coming from the target bit-rate of the optical communication standard. With respect to the exemplary block diagram of the amplifier circuit 101 according to FIG. 6 the target bandwidth can be achieved with maximum gain by properly selecting the value of the terminating resistor Rg. In fact, the bandwidth of the amplifier circuit 101 can be approximated with the following equation:

$$\text{bandwith} \approx \frac{1}{2 \cdot \pi \cdot R_g \cdot C_{out}} \quad (1)$$

where "Cout" is the parasitic output capacitance of the gain amplifier 102. As a consequence, the value of the resistor Rg can be chosen to result the target bandwidth according to the value of the parasitic output capacitance Cout. Once the value of Rg is selected, the gain of the amplifier circuit 101 is defined according to the following equation:

$$\text{gain} \approx A_{V\_DA} \cdot G_{m\_GA} \cdot R_g \quad (2)$$

where "AV_DA" is the voltage gain of the distributed amplifier 103 and "Gm_GA" is the transconductance gain of the gain amplifier 102. At the same time, also the bias voltage VA of the gain amplifier 102 is defined according to the following equation $$V_A = V_{DD} - I_g \cdot R_g \quad (3)$$

The value of the terminating resistor Rg may be selected by using the above equations (1) and (2) to optimize the gain/bandwidth product as required by the optical communication standard. However, this choice also assigns the bias voltage VA of the gain amplifier 102 according to the above equation (3). That is, the optimum value for the terminating resistor Rg affects the DC bias condition of the gain amplifier 102, making the gain amplifier 102 and, thus, the amplifier circuit 101 very sensitive to process, voltage and temperature variations (PVT variations).

Considering equation (3), it is possible that the bias current Ig increases due to process or temperature variations, or the DC voltage VDD, provided to the amplifier circuit for biasing the amplifier circuit, reduces due to voltage variations, then the bias voltage VA of the gain amplifier 102 decreases becoming lower than the minimum bias voltage for normal operation of the gain amplifier 102, resulting in an increase of nonlinearity of the amplifier circuit 101. That is, if the bias current Ig increases due to process or temperature variations, or if the DC voltage VDD reduces due to voltage variations, then the bias voltage VA of the gain amplifier 102 can reduce outside operating conditions of the gain amplifier 102.

If this problem occurs, a solution may be to reduce the value of the terminating resistor Rg. As a consequence the nominal bias voltage VA of the gain amplifier 102 increases (cf. equation (3)) resulting in greater margin with respect to process, temperature and voltage variations and, thus, reduced sensitivity to process, voltage and temperature variations.

However, as a result of reducing the terminating resistor Rg the gain of the amplifier circuit 101 also decreases as demonstrated by the above equation (2). As a consequence the optimum gain/bandwidth product is not achieved.

In order to better clarify the problem of the conventional solution, i.e. reducing the terminating resistor Rg, typical performances of an amplifier circuit comprising a cascade of a gain amplifier and a distributed amplifier with the output of the gain amplifier being connected to the input of the distributed amplifier and the input of the distributed amplifier being terminated on a terminating resistor Rg, such as the amplifier circuit 101 of FIG. 6, are reported in FIG. 7(a) to FIG. 7(d).

Figure 7:
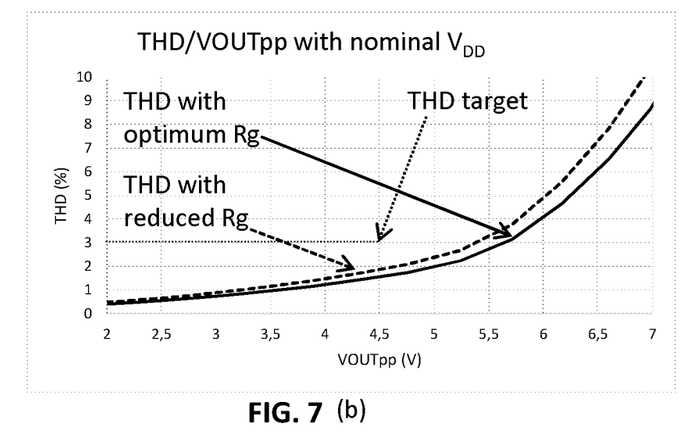
FIG. 7(a) exemplarily shows the gain/bandwidth product of the amplifier circuit of FIG. 6 with nominal DC voltage VDD being provided to the amplifier circuit.
FIG. 7(b) exemplarily shows the relationship between the total harmonic distortion (THD) of the amplifier circuit of FIG. 6 and theVOUTpp of the amplifier circuit of FIG. 6 with nominal DC voltage VDD being provided to the amplifier circuit.
FIG. 7(c) exemplarily shows the gain/bandwidth product of the amplifier circuit of FIG. 6 with a corner DC voltage VDD being provided to the amplifier circuit.
FIG. 7(d) exemplarily shows the relationship between the total harmonic distortion (THD) of the amplifier circuit of FIG. 6 and theVOUTpp of the amplifier circuit of FIG. 6 with the corner DC voltage VDD being provided to the amplifier circuit.

FIG. 7(a) shows the gain/bandwidth product with nominal DC voltage VDD being provided to the amplifier circuit for biasing the amplifier circuit; wherein the vertical axis indicates the gain (S21) of the amplifier circuit in dB and the horizontal axis indicates the frequency in GHz. FIG. 7(b) shows the relationship between the total harmonic distortion (THD) of the amplifier circuit and theVOUTpp of the amplifier circuit with nominal DC voltage VDD being provided to the amplifier circuit for biasing the amplifier circuit; wherein the vertical axis indicates the total harmonic distortion (THD) of the amplifier circuit as a percentage (%) and the horizontal axis indicates theVOUTpp of the amplifier circuit in Volts (V).

FIG. 7(c) shows the gain/bandwidth product with a corner value of the DC voltage VDD being provided to the amplifier circuit; wherein the vertical axis indicates the gain (S21) of the amplifier circuit in dB and the horizontal axis indicates the frequency in GHz. FIG. 7(d) shows the relationship between the total harmonic distortion (THD) of the amplifier circuit and theVOUTpp of the amplifier circuit with the corner value of the DC voltage VDD being provided to the amplifier circuit; wherein the vertical axis indicates the total harmonic distortion (THD) of the amplifier circuit as a percentage (%) and the horizontal axis indicates theVOUTpp of the amplifier circuit in Volts (V). The corner value of the DC voltage VDD is smaller than the nominal value of the DC voltage VDD.

It is assumed, that the target bandwidth for the amplifier circuit is 30 GHz, as shown in FIG. 7(a) and FIG. 7(c) with a dotted vertical line. In order to achieve an optimum gain/bandwidth product a value of e.g. 55 Ohm is selected for the terminating resistor Rg, obtaining a gain (S21) of 30 dB as shown in FIG. 7(a) with a solid line. The total harmonic distortion (THD) of the amplifier circuit, when the value of the terminating resistor Rg is selected to e.g. 55 Ohm for achieving an optimum gain/bandwidth product, is shown in FIG. 7(b) with a solid line. The target for the THD is assumed such that the THD has to be lower than 3% up to 4.5 V of peak-to-peak output voltage (VOUTpp), as shown in FIG. 7(b) and FIG. 7(d) with a dotted horizontal line. These performances, shown in FIG. 7(a) and FIG. 7(b), are obtained with a nominal DC voltage VDD of e.g. 3.3 V, wherein the DC voltage VDD is provided to the amplifier circuit in order to provide the bias current Ig and the bias voltage VA to the gain amplifier of the amplifier circuit. As a result of providing the nominal DC voltage VDD the amplifier circuit, in particular the gain amplifier of the amplifier circuit, is properly biased. In this "nominal" condition the bias current Ig of the gain amplifier is assumed to be e.g. 20 mA and the bias voltage VA of the gain amplifier is 2.2 V, assuming that the value of the nominal DC voltage equals to 3.3 V and the value of the terminating resistor Rg equals to 55 Ohm (cf. above equation (3)).

However, due to a voltage variation, the DC voltage VDD can reduce to 3V in a corner case, resulting then in a bias voltage VA of the gain amplifier that equals only to 1.9 V (cf. above equation (3)), which is a value lower than the minimum bias voltage for normal operation of the gain amplifier. That is the gain amplifier and, thus, the amplifier circuit are not anymore properly biased. In this "corner" condition the gain (S21) of the amplifier circuit becomes as shown in FIG. 7(c) with a solid line and the THD becomes as shown in FIG. 7(d) with a solid line (assuming that the terminating resistor is kept at the value of e.g. 55 Ohm for achieving an optimum gain/bandwidth product). As can be seen in FIG. 7(d), in the "corner" condition the THD (shown by the solid line) is outside the above described target for the THD, because the THD is not lower than 3% up to 4.5 V of peak-to-peak output voltage (VOUTpp).

In order to solve this problem as a result of the DC voltage VDD varying (the nominal value of the DC voltage VDD reduces to a corner value), the solution proposed in the prior-art is to reduce the value of the terminating resistor Rg, as described already above. For example selecting the terminating resistor Rg such that it equals to e.g. 45 Ohm (instead of the previously assumed 55 Ohm) results in that, in the above described "corner" case (VDD=3V), the THD of the amplifier circuit is again in the above described target for the THD, as shown in FIG. 7(d) with a dashed line. Namely, in FIG. 7(d) the dashed line showing the THD for the reduced value of the terminating resistor Rg is up to VOUTpp=4.5 V below the dotted horizontal line showing the target THD.

Referring to the above equation (3), in the "corner" case (VDD=3V) with the terminating resistor Rg being reduced to 45 Ohm, the bias voltage VA of the gain amplifier would equal to 2.1 V (assuming that Ig=20 mA) and the gain amplifier would be properly biased. However, as a result of the reduced value of the terminating resistor Rg the gain (S21) of the amplifier circuit is reduced by about 1 dB, as shown in FIG. 7(a) with a dashed line for the nominal DC voltage VDD and as shown in FIG. 7(c) with a dashed line for the corner DC voltage VDD. At the same time, the reduced value of the terminating resistor Rg worsens the THD behavior of the amplifier circuit when the nominal DC voltage VDD is supplied to the amplifier circuit, as shown in FIG. 7(b) with a dashed line.

This performance comparison of the amplifier circuit has demonstrated that with the above described solution proposed in the prior-art (reducing the value of the terminating resistor Rg) to counter a change in the DC voltage VDD (from nominal DC voltage to corner DC voltage) it is not possible to simultaneously optimize the gain/bandwidth product and linearity of the amplifier circuit, such as the amplifier circuit shown in FIG. 6, considering process, voltage and temperature variations. The linearity of the amplifier circuit is dependent on the biasing of the amplifier circuit.

Figure 1:
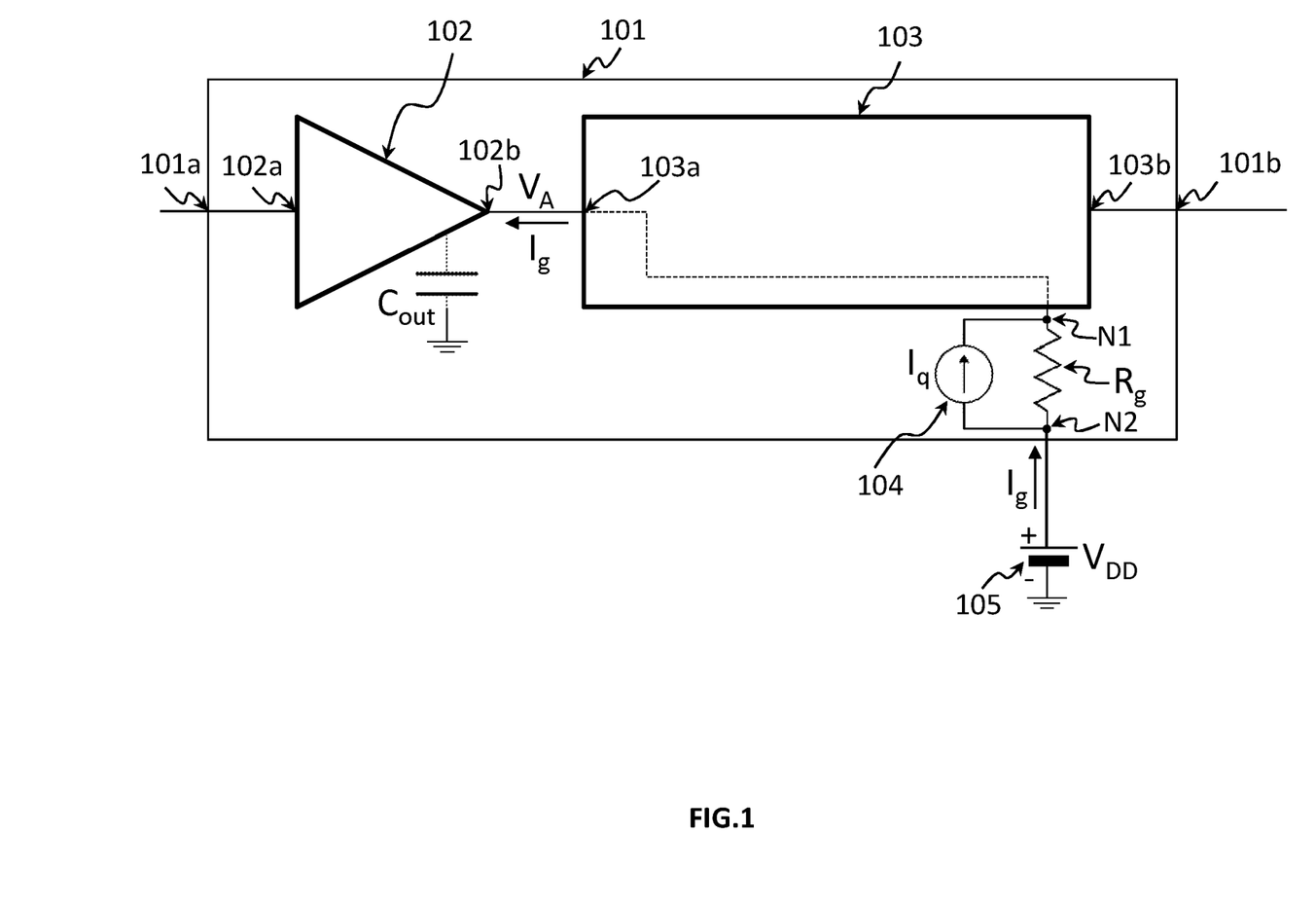
FIG. 1 shows a block diagram of an amplifier circuit according to an embodiment of the invention with a current source for setting the bias voltage VA of the gain amplifier of the amplifier circuit according to one embodiment of the present disclosure.

FIG. 1 shows a block diagram of an amplifier circuit 101 (driver amplifier) according to an embodiment of the invention. The amplifier circuit 101 comprises a gain amplifier 102 and a distributed amplifier 103. The gain amplifier 102 is configured to amplify an electrical signal provided to its input 102a to a target gain level. The distributed amplifier 103 is configured to achieve a matched output impedance of the amplifier circuit 101 in a wideband range.

Embodiments of the present invention is not limited to a specific gain amplifier and, thus, any gain amplifier known to the skilled person can be used for implementing the gain amplifier 102. The same applies to the distributed amplifier 103 and, thus, any distributed amplifier known to the skilled person can be used for implementing the distributed amplifier 103.

The input 103a of the distributed amplifier 103 is electrically connected to the output 102b of the gain amplifier 102. Thus, the gain amplifier 102 and the distributed amplifier 103 are cascaded in the amplifier circuit 101. The input 102a of the gain amplifier 102 is connected to the input 101a of the amplifier circuit 101 and the output 103b of the distributed amplifier 103 is connected to the output 101b of the amplifier circuit 101.

The amplifier circuit 101 further comprises a resistor Rg which terminates the input 103a of the distributed amplifier 103. This is indicated in FIG. 1 by the dashed line drawn between the input 103a of the distributed amplifier 103 and the resistor Rg. The resistor Rg may also be called "terminating resistor". In particular, the resistor Rg is an input matching resistor terminating the input 103a of the distributed amplifier 103.

According to FIG. 1 the resistor Rg is not part of the distributed amplifier 103. Alternatively, the resistor Rg can be part of the distributed amplifier 103.

As shown in FIG. 1, a DC voltage source 105 may be electrically connected to the resistor Rg. The DC voltage source 105 provides a DC voltage VDD for biasing the amplifier circuit 101, in particular for biasing the gain amplifier 102. That is, the DC voltage source 105 may be electrically connected to the resistor Rg for providing a bias current Ig and a bias voltage VA to the output 102b of the gain amplifier 102 via the input 103a of the distributed amplifier 103. In particular the DC voltage source 105 may be connected to the terminal N2 of the resistor Rg, whereas the input 103a of the distributed amplifier 103 is connected to the other terminal N1 of the resistor Rg.

The amplifier circuit 101 also comprises a current source 104 which is electrically connected in parallel to the resistor Rg. The current source 104 is configured to set the bias voltage VA by setting the current flowing from the DC voltage source 105 through the resistor Rg.

According to FIG. 1 the current source 104 is not part of the distributed amplifier 103. Alternatively, the current source 104 can be part of the distributed amplifier 103.

The current source 104 is configured to set the current flowing through the resistor Rg by shunting a part of the current Ig provided by the DC voltage source 105 away from the resistor Rg. In particular, the current source 104 is configured to set the current flowing through the resistor Rg to a value that is lower than the value of the current Ig provided by the DC voltage source 105. The current source 104 is configured to reduce the voltage drop at the resistor Rg by reducing the current flowing through the resistor Rg.

As can be seen in FIG. 1, the bias current Ig biasing the gain amplifier 102 does not fully flow across the resistor Rg, but a part of it flows across the current source 104.

In particular, the current source 104 has an impedance that is higher than the impedance of the resistor Rg. Therefore, the current source 104 behaves as a high impedance for a signal that is applied to the input 101a of the amplifier circuit 101. As a consequence the gain and bandwidth of the amplifier circuit 101 are not dependent on the current source 104. The above equation (1) is valid for the bandwidth of the amplifier circuit 101 and the above equation (2) is valid for the gain of the amplifier circuit 101.

Since the current source 104 is electrically connected in parallel to the resistor Rg, it may shunt the current flowing through the resistor and, thus, set the current flowing through the resistor Rg from the DC voltage source 105. In particular, the current source 104 may reduce the current flowing through the resistor Rg. As a result, in the amplifier circuit 101 according to FIG. 1 the nominal bias voltage VA of the gain amplifier 102 is higher compared to the nominal bias voltage of the gain amplifier of the amplifier circuit of FIG. 6, as demonstrated by equation (4) that is valid for the amplifier circuit 101 of FIG. 1:

$$V_A = V_{DD} - (I_g - I_q) \cdot R_g \qquad (4)$$

For the above equation (4) it is assumed, that a DC voltage source is connected to the resistor for providing a DC voltage VDD for biasing the amplifier circuit, in particular the gain amplifier. In equation (4) "Iq" represents the current that is shunted respectively drawn by the current source 104, "Ig-Iq" represent the current flowing through the resistor Rg (terminating resistor), "Ig" represents the bias current provided to the output 102b of the gain amplifier 102 and "VA" represent the bias voltage provided to the output 102b of the gain amplifier 102.

When comparing the equation (4) which is valid for the amplifier circuit of FIG. 1 with the equation (3) which is valid for an amplifier circuit without a current source, such as the amplifier circuit of FIG. 6, the following may be noticed:

The nominal bias voltage VA of the gain amplifier 102 of the amplifier circuit 101 according to FIG. 1 (cf. equation (4)) is higher compared to the nominal bias voltage VA of a gain amplifier without a current source, such as the amplifier circuit of FIG. 6, (cf. equation (3)). Namely, in the amplifier circuit 101 according to FIG. 1 the current Ig-Iq flowing through the terminating resistor Rg is reduced by the current Iq that is shunted by the current source 104 in comparison to the current Ig flowing through the terminating resistor of an amplifier circuit without a current source connected in parallel to the terminating resistor.

Therefore, in the amplifier circuit 101 according to FIG. 1 there is more margin to the minimum bias voltage of the gain amplifier, resulting in lower sensitivity to process, voltage and temperature variations. With other words, the current source 104 in the amplifier circuit 101 of FIG. 1 increases the bias voltage VA of the gain amplifier 102 and, thus, there is more margin to the minimum bias voltage of the gain amplifier 102, resulting in lower sensitivity of the amplifier circuit 101 to process, voltage and temperature variations.

At the same time, the current source 104 behaves as a high impedance for a signal that may be provided to the input 101a of the amplifier circuit 101. As a consequence the gain and bandwidth of the driver amplifier 101 are not dependent on it.

Thus, as shown in FIG. 1 and equation (4), an aspect of embodiments of the invention is to connect a current source 104 in parallel to the resistor Rg terminating the input 103a of the distributed amplifier 103. The current source 104 reduces the voltage drop at the resistor Rg by reducing the current flowing through the resistor Rg. This increases the bias voltage VA of the gain amplifier 102 and, thus, results in lower sensitivity of the amplifier circuit 101 to process, voltage and temperature variations. At the same time, the current source 104 does not affect a signal that may be provided to the input 101a of the amplifier circuit 101, because the current source behaves as a high impedance.

Figure 3:
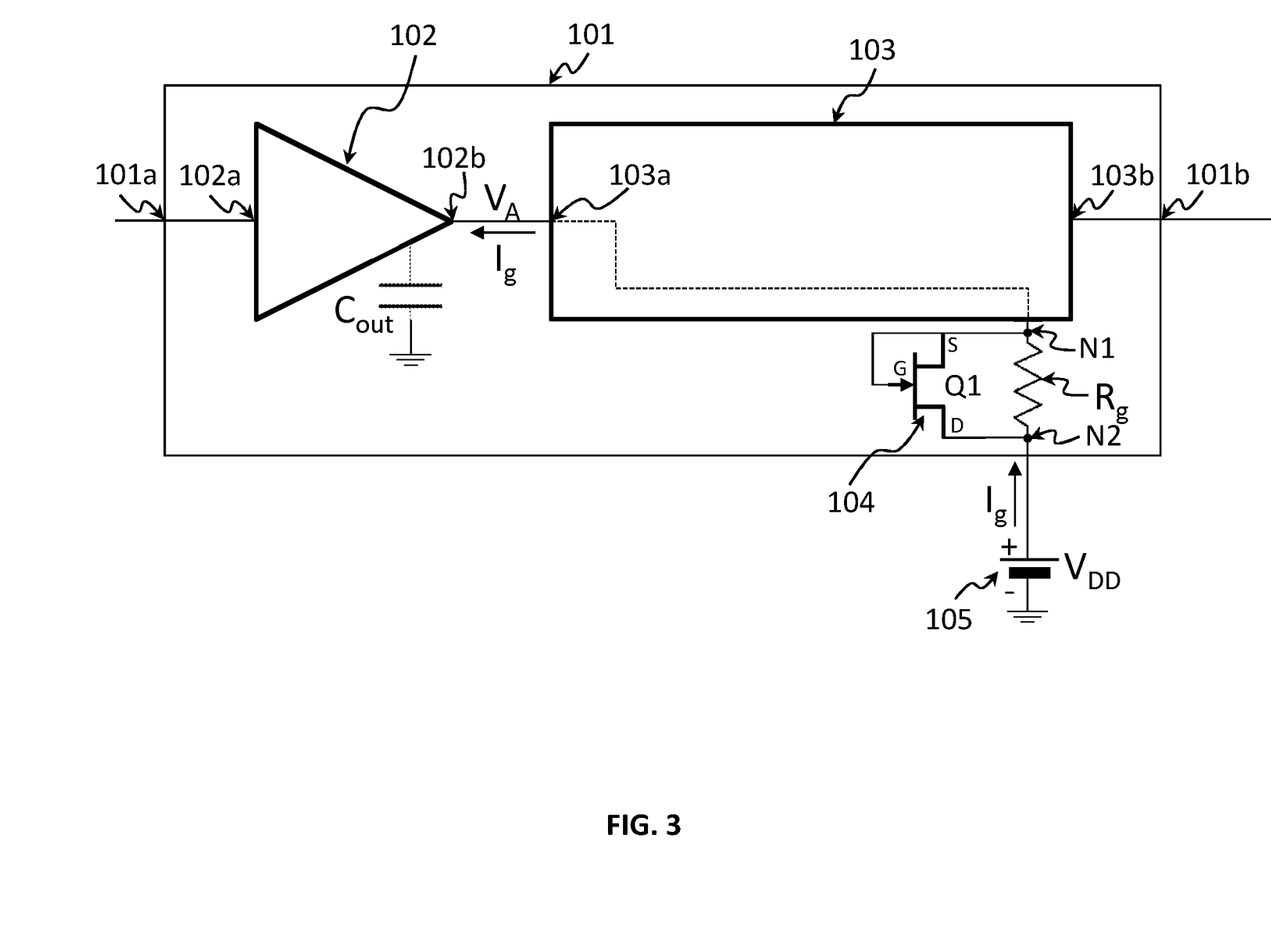
FIG. 3 shows a block diagram of an amplifier circuit with a current source comprising a transistor for setting the bias voltage VA of the gain amplifier of the amplifier circuit according to one embodiment of the present disclosure.

Particularly, the current source 104 comprises a transistor configured to set the current flowing through the resistor Rg (not shown in FIG. 1, shown in FIG. 3). However the current source 104 may also be differently implemented, as long as it is able to set, in particular reduce, the current flowing through the resistor Rg by shunting a part of the current Ig provided from the DC voltage source 105 away from the resistor Rg.

Particularly, the amplifier circuit 101 is configured to be implemented in an integrated circuit, in particular in a Monolithic Microwave Integrated Circuit.

The value of the resistor Rg is particularly selected to optimize the gain/bandwidth product of the amplifier circuit 101.

In order to better clarify the benefit of the amplifier circuit 101 according to FIG. 1, the performances of the amplifier circuit 101 according to FIG. 1 are shown in FIG. 2(a) to (d).

Figure 2:
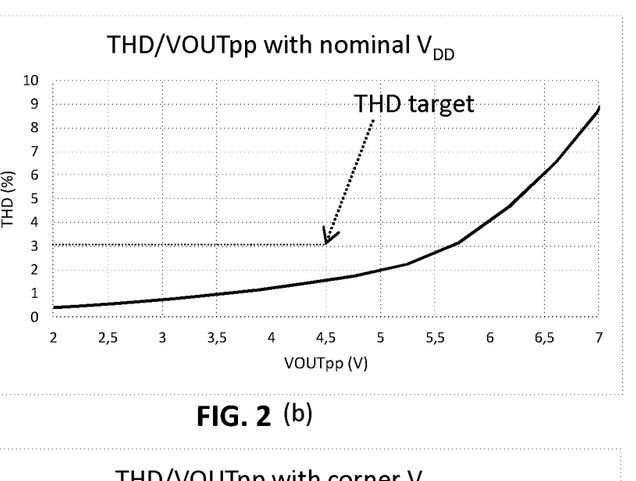
FIG. 2(a) exemplarily shows the gain/bandwidth product of the amplifier circuit according to the embodiment of FIG. 1 with nominal DC voltage VDD being provided to the amplifier circuit according to one embodiment of the present disclosure.
FIG. 2(b) exemplarily shows the relationship between the total harmonic distortion (THD) of the amplifier circuit according to the embodiment of FIG. 1 and theVOUTpp of the amplifier circuit according to the embodiment of FIG. 1 with nominal DC voltage VDD being provided to the amplifier circuit according to one embodiment of the present disclosure.
FIG. 2(c) exemplarily shows the gain/bandwidth product of the amplifier circuit according to the embodiment of FIG. 1 with a corner DC voltage VDD being provided to the amplifier circuit according to one embodiment of the present disclosure.
FIG. 2(d) exemplarily shows the relationship between the total harmonic distortion (THD) of the amplifier circuit according to the embodiment of FIG. 1 and theVOUTpp of the amplifier circuit according to the embodiment of FIG. 1 with the corner DC voltage VDD being provided to the amplifier circuit according to one embodiment of the present disclosure.

FIG. 2(a) exemplarily shows the gain/bandwidth product of the amplifier circuit according to the embodiment of FIG. 1 with nominal DC voltage VDD being provided to the amplifier circuit. FIG. 2(b) exemplarily shows the relationship between the total harmonic distortion (THD) of the amplifier circuit according to the embodiment of FIG. 1 and theVOUTpp of the amplifier circuit according to the embodiment of FIG. 1 with nominal DC voltage VDD being provided to the amplifier circuit.

FIG. 2(c) exemplarily shows the gain/bandwidth product of the amplifier circuit according to the embodiment of FIG. 1 with a corner DC voltage VDD being provided to the amplifier circuit. FIG. 2(d) exemplarily shows the relationship between the total harmonic distortion (THD) of the amplifier circuit according to the embodiment of FIG. 1 and theVOUTpp of the amplifier circuit according to the embodiment of FIG. 1 with the corner DC voltage VDD being provided to the amplifier circuit.

In FIG. 2(a) and FIG. 2(c) the vertical axis indicates the gain (S21) of the amplifier circuit in dB and the horizontal axis indicates the frequency in GHz. In FIG. 2(b) and FIG. 2(d) the vertical axis indicates the total harmonic distortion (THD) of the amplifier circuit as a percentage (%) and the horizontal axis indicates theVOUTpp of the amplifier circuit in Volts (V).

The performances of the amplifier circuit 101 of FIG. 1 shown in FIG. 2(a) and FIG. 2(b) are obtained with a nominal DC voltage VDD of e.g. 3.3 V being provided by the DC voltage source 105, that may be connected to the terminating resistor Rg of the amplifier circuit 101 of FIG. 1. Thus, the nominal voltage VDD selected for FIG. 2(a) and FIG. 2(b) corresponds to the nominal voltage VDD selected for FIG. 7(a) and FIG. 7(b).

In FIG. 2(a) and FIG. 2(c) the target bandwidth for the amplifier circuit 101 is assumed to be 30 GHz, as shown in FIG. 2(a) and FIG. 2(c) by a dotted vertical line. This target bandwidth corresponds to the target bandwidth assumed for the above described FIG. 7(a) and FIG. 7(c). In order to achieve optimum gain/bandwidth product a value of e.g. 55 Ohm is selected for the terminating resistor Rg of the amplifier circuit 101 of FIG. 1 and the current source 104 of the amplifier circuit 101 of FIG. 1 is implemented such that it draws respectively shunts a current Iq of e.g. 4 mA. This results in a gain (S21) of 30 dB as shown in FIG. 2(a) with a solid line. Thus, the gain of the amplifier circuit according to the present invention is the same as the gain of an amplifier circuit without a current source, shown in FIG. 7(a) with a solid line. Namely, the current source 104 of the amplifier circuit 101 of FIG. 1 behaves as a high impedance and, thus, the current source 104 has no influence on the gain and bandwidth of the amplifier circuit 101 of FIG. 1.

The total harmonic distortion (THD) of the amplifier circuit 101 according to FIG. 1 for the "nominal" condition is shown in FIG. 2(b) with a solid line. The target for the THD is assumed such that the THD has to be lower than 3% up to 4.5 V of peak-to-peak output voltage VOUTpp (THD<3% up to 4.5 V peak-to-peak), as indicated in FIG. 2(b) and FIG. 2(d) with a dotted horizontal line. As can be seen from the solid line of FIG. 2(b) and the solid line of FIG. 7(b), in the "nominal" condition (the nominal DC voltage VDD of e.g. 3.3 V is supplied to the amplifier circuit) the performance of the amplifier circuit 101 of FIG. 1 with regard to the THD is the same as the performance of an amplifier circuit without a current source, such as the amplifier circuit of FIG. 6, with regard to the THD.

The performances of the amplifier circuit 101 of FIG. 1 shown in FIG. 2(c) and FIG. 2(d) are obtained with a corner DC voltage VDD of e.g. 3 V being provided by the DC voltage source 105, that may be connected to the terminating resistor Rg of the amplifier circuit 101 of FIG. 1. Thus, the corner voltage VDD for which FIG. 2(c) and FIG. 2(d) show the performance of the amplifier circuit 101 of FIG. 1 corresponds to the corner voltage VDD on which FIG. 7(c) and FIG. 7(d) are based on.

When considering the "corner" condition, i.e. a reduced DC voltage VDD of e.g. 3V is provided to the amplifier circuit, the amplifier circuit 101 of FIG. 1 allows to obtain a much better THD that complies to the specification (THD<3% up to 4.5 V peak-to-peak), as shown in FIG. 2(d) with a solid line. This is because according to equation (4):

$$V_A = V_{DD} - (I_g - I_q) \cdot R_g \qquad (5)$$

The nominal bias voltage VA of the gain amplifier 102 of the amplifier circuit 101 of FIG. 1 equals to 2.42 V, when assuming that the nominal DC voltage VDD equals to 3.3 V, the bias current Ig of the gain amplifier equals to 20 mA, the current Iq shunted by the current source 104 equals to 4 mA, and the terminating resistor Rg equals 55 Ohm in order to achieve an optimum gain/bandwidth product.

Thus, as a result of the current source 104 the nominal bias voltage VA of the gain amplifier 102 of the amplifier circuit 101 of FIG. 1 is increased compared to the nominal bias voltage VA of the gain amplifier of an amplifier circuit without a current source, such as the amplifier circuit of FIG. 6. As a result, in the amplifier circuit 101 according to FIG. 1 there is more margin to the minimum bias voltage of the gain amplifier, resulting in lower sensitivity to process, voltage and temperature variations.

Namely, according to equation (3):

$$V_A = V_{DD} - I_g \cdot R_g \qquad (6)$$

Which is valid for an amplifier circuit without a current source, such as the amplifier circuit of FIG. 6, the nominal bias voltage VA of the gain amplifier only equals to 2.2 V, when assuming that the nominal DC voltage VDD equals to 3.3 V, the bias current Ig of the gain amplifier equals to 20 mA, and the terminating resistor Rg equals 55 Ohm in order to achieve an optimum gain/bandwidth product.

Therefore, when in the "corner" condition the DC voltage VDD reduces to a corner value of 3 V, the bias voltage VA of the gain amplifier 102 of the amplifier circuit 101 of FIG. 1 reduces from 2.42 V ("nominal" condition) to 2.12 V ("corner" condition). This reduced bias voltage VA of 2.12 V is still in the operating range for the gain amplifier and, thus, the gain amplifier 102 of the amplifier circuit 101 of FIG. 1 is properly biased in the "corner" condition. Namely, as mentioned already above, due to the increased nominal bias voltage VA of the gain amplifier 102 of the amplifier circuit 101 according to FIG. 1 there is more margin to the minimum bias voltage of the gain amplifier, resulting in lower sensitivity to process, voltage and temperature variations. As a result, in the "corner" condition the THD of the amplifier circuit 101 of FIG. 1 is lower than 3% up to 4.5 V of peak-to-peak output voltage VOUTpp, as shown with the solid line in FIG. 2(d).

In contrast thereto, when in the "corner" condition the DC voltage VDD reduces to a corner value of 3 V, the bias voltage VA of the gain amplifier of the amplifier circuit without a current source, such as the amplifier circuit of FIG. 6, reduces from 2.2 V ("nominal" condition) to 1.9 V ("corner" condition), cf. equation (3). This reduced bias voltage VA is not anymore in the operating range for the gain amplifier and, thus, the gain amplifier is not properly biased. As a result, in the "corner" condition the THD is outside the target for the THD, as shown in FIG. 7(d) with a solid line. Namely, as can be seen in FIG. 7(d), in the "corner" condition the THD is outside the target for the THD (when the terminating resistor Rg has a value of e.g. 55 Ohm for achieving an optimum gain/bandwidth product), because the THD is not lower than 3% up to 4.5 V of peak-to-peak output voltage (VOUTpp). The solid line in FIG. 7(d) is not below the dotted horizontal line up to 4.5 V of peak-to-peak output voltage.

In the light of the above, FIG. 2(a) to (d) demonstrate that by implementing an amplifier circuit according to the invention, such as the amplifier circuit 101 according to FIG. 1, it is possible to simultaneously optimize the gain/bandwidth product and linearity of the amplifier circuit considering process, voltage and temperature variations.

With respect to an amplifier circuit without a current source, such as the amplifier circuit shown in FIG. 6, the amplifier circuit according to the invention allows to realize an amplifier circuit with reduced process, voltage and temperature (PVT) sensitivity without degrading other key performances, such as DC power consumption, gain, bandwidth, output return loss, input return loss, circuit complexity, integrability and required bias voltages.

FIG. 3 shows a block diagram of an amplifier circuit 101 according to an embodiment of the invention, which builds on the amplifier circuit 101 shown in FIG. 1. Same elements in FIG. 1 and FIG. 3 share the same reference signs and function likewise.

In the amplifier circuit 101 of FIG. 3 the current source 104 comprises a transistor Q1, in particular is implemented as a transistor Q1. The transistor Q1 is configured to set the current flowing through the resistor Rg. In particular, the transistor Q1 is configured to behave as a current source. Particularly, the transistor Q1 is configured to set the current flowing from the DC voltage source 105 through the resistor Rg such that at least one third of the bias current Ig flows through the resistor Rg.

As shown in FIG. 3 the transistor Q1 of the current source 104 is a field-effect transistor, in particular a metal-oxide-semiconductor field-effect transistor. The source terminal S and the gate terminal G of the field-effect transistor Q1 are electrically connected to the terminal N1 of the resistor Rg that is electrically connected to the input 103a of the distributed amplifier 103. The drain terminal D is electrically connected to another terminal N2 of the resistor Rg, to which the DC voltage source 105 can be electrically connected.

The implementation of the transistor Q1 is not limited to the one shown in FIG. 3. For example, the transistor Q1 could also be a bipolar junction transistor (not shown in FIG. 3). In this case, particularly the emitter terminal and the base terminal of the bipolar junction transistor would be electrically connected to the terminal N1 of the resistor Rg that is electrically connected to the input 103a of the distributed amplifier 103. The collector terminal of the bipolar junction transistor would particularly be electrically connected the other terminal N2 of the resistor Rg, to which the DC voltage source can be electrically connected.

Particularly the size of the transistor Q1 is selected to obtain the desired margin for the bias voltage VA of the gain amplifier 102 with regard to process, voltage and temperature variations.

The amplifier circuit 101 shown in FIG. 3 is advantageous, as it is an easy and cheap way to fully integrate an amplifier circuit according to the invention in integrated circuit technologies, in particular in Monolithic Microwave Integrated Circuit technologies.

Figure 4:
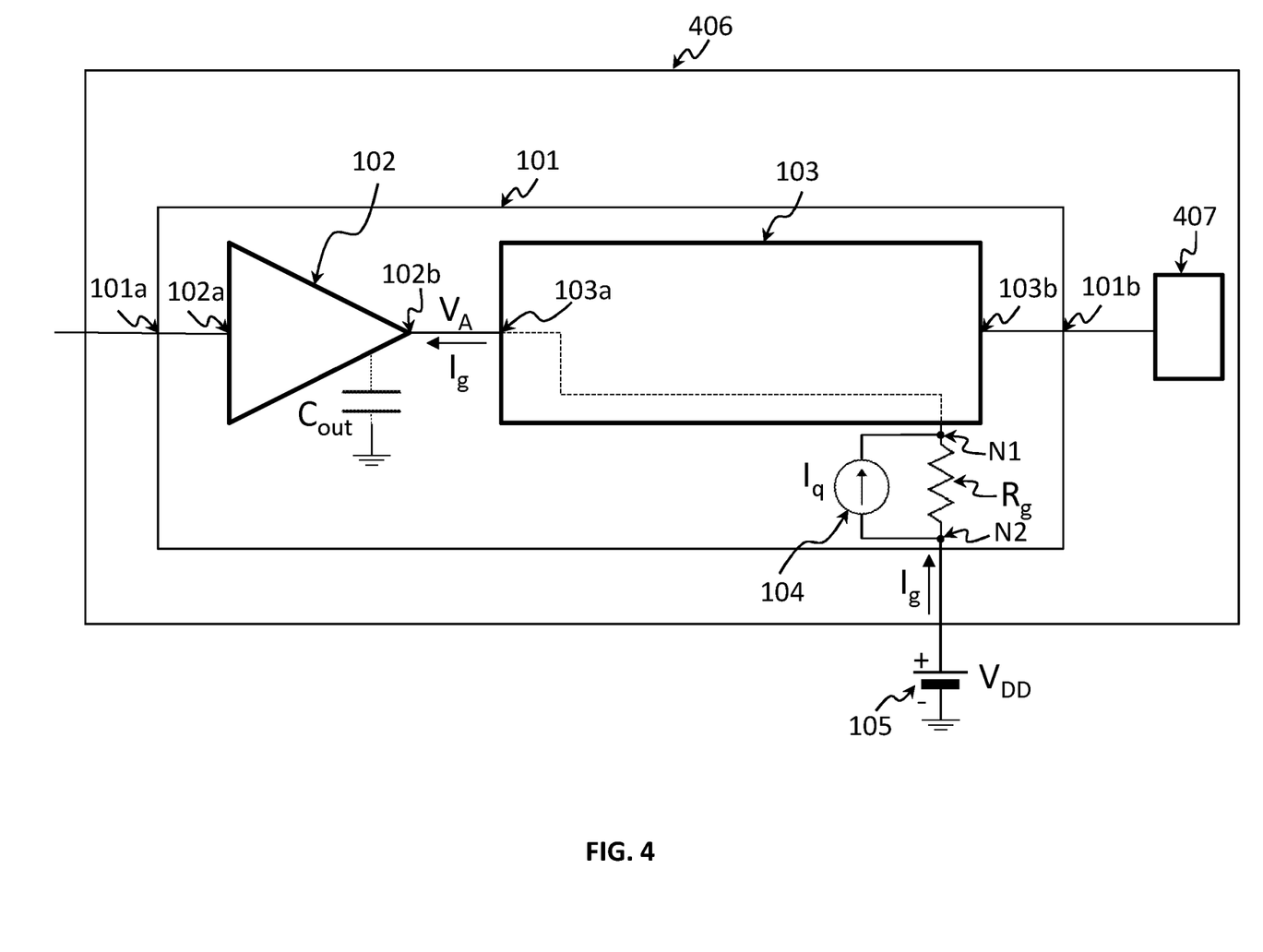
FIG. 4 shows a block diagram of a transmitter according to an embodiment of the invention comprising an amplifier circuit according to an embodiment of the disclosure.

FIG. 4 shows a block diagram of a transmitter 406 according to an embodiment of the invention. The transmitter 406 comprises the amplifier circuit 101 as described above, i.e. as in any one of FIG. 1 and FIG. 3. The transmitter 406 is in particular an optical transmitter respectively a transmitter for optical communications.

The transmitter 406 further comprises an electro-optical modulator 407 that is configured to generate an optical signal. The present invention is not limited to a specific electro-optical modulator and, thus, any electro-optical modulator known to the skilled person can be used for implementing the electro-optical modulator 407. The electro-optical modulator 407 is electrically connected to the output 101b of the amplifier circuit 101, in particular to the output 103b of the distributed amplifier 103 of the amplifier circuit 101.

The amplifier circuit 101 is configured to amplify an electrical signal supplied to its input 101a in order to drive the electro-optical modulator 407.

Figure 5:
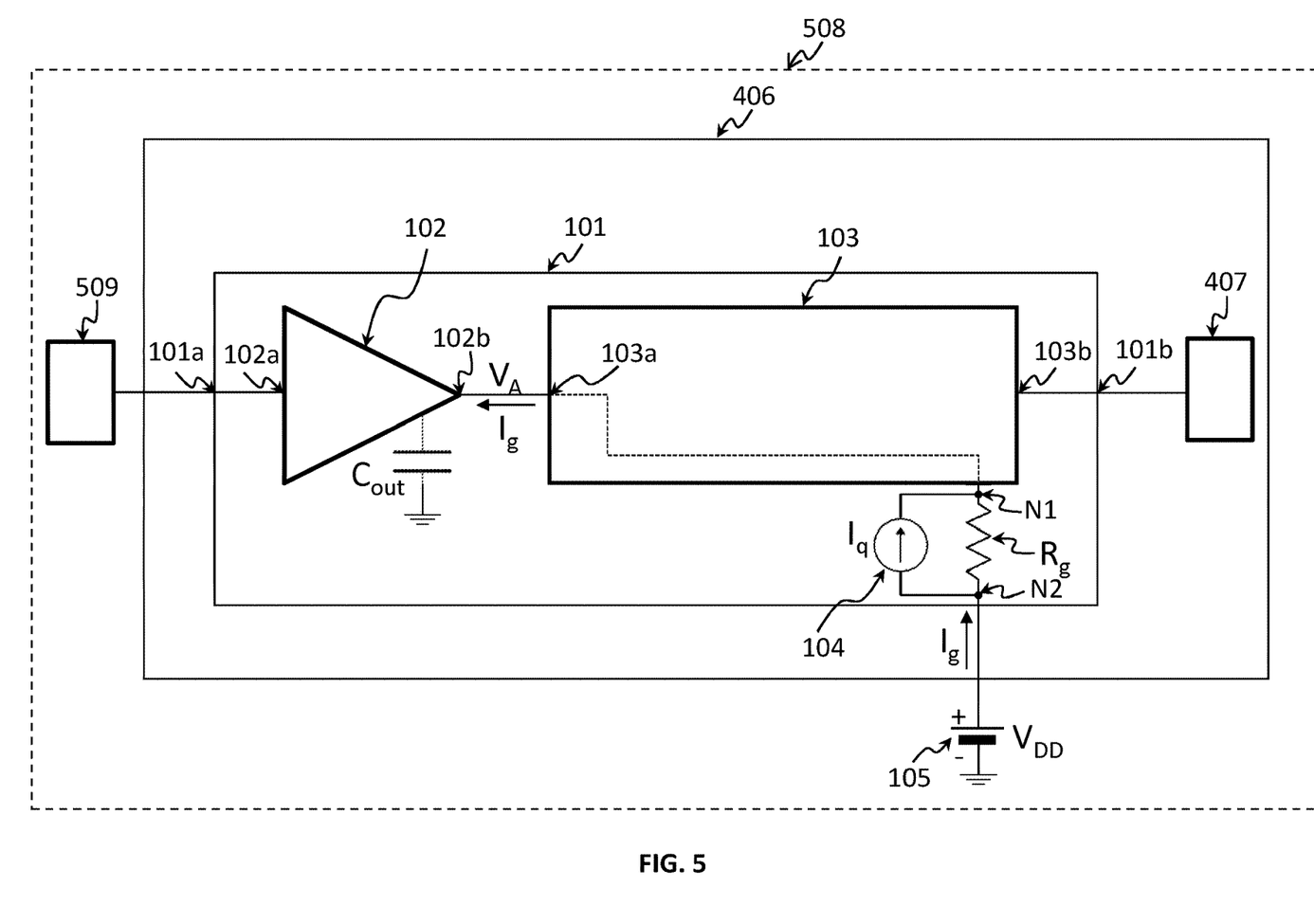
FIG. 5 shows a block diagram of a system according to an embodiment of the invention comprising a transmitter according to an embodiment of the disclosure.

FIG. 5 shows a block diagram of a system 508 according to an embodiment of the invention. The system 508 comprises the terminal 406 as described above, i.e. as in FIG. 4.

The system further comprises a signal source 509 that is electrically connected to the input 101a of the amplifier circuit 101 of the terminal 406. In particular, the signal source 509 is electrically connected to the input 102a of the gain amplifier 102 of the amplifier circuit 101. Particularly, the signal source 509 is a digital source, in particular a high speed digital source.

The signal source 509 is configured to provide an electrical signal to the input 101a of the amplifier circuit 101, in particular to the input 102a of the gain amplifier 102, in order to drive the electric-optical modulator 407 which is connected to the output 101b of the amplifier circuit 101. The electric signal supplied from the signal source 509 is amplified by the amplifier circuit 101 and then output via the output 101b to the electric-optical modulator 407, such that the electrical-optical modulator 407 is driven by the amplified electrical signal.

The system further comprises the DC voltage source 105 that is electrically connected to the resistor Rg terminating the input terminal 103a of the distributed amplifier 103 of the amplifier circuit 101. The DC voltage source 105 is configured to provide a DC voltage VDD to the amplifier circuit 101 for providing a bias current Ig and a bias voltage VA to the output 102b of the gain amplifier 102 via the input 103a of the distributed amplifier 103. The current source 104, connected in parallel to the resistor Rg, is configured to set the bias voltage VA of the gain amplifier 102 by setting the current flowing from the DC voltage source 105 through the resistor Rg and, thus, by setting the voltage drop at the resistor Rg.

The present disclosure has been described in conjunction with various embodiments as examples as well as implementations. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

In addition, techniques, systems, subsystems, and methods described and illustrated in the various embodiments as discrete or separate may be combined or integrated with other systems, modules, techniques, or methods without departing from the scope of the present disclosure. Other items shown or discussed as electrically connected, connected, coupled, directly coupled, or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

For the purpose of clarity, and without limitation, the following is a listing of at least some of the elements as referenced in the present disclosure:

101 amplifier circuit (driver amplifier)
101a input of amplifier circuit
101b output of amplifier circuit
102 gain amplifier
102a input of gain amplifier
102b output of gain amplifier
103 distributed amplifier
103a input of distributed amplifier
103b output of distributed amplifier
Cout parasitic output capacitance of gain amplifier
$R_g$ resistor terminating input of distributed amplifier (terminating resistor)
N1, N2 terminals of resistor terminating input of distributed amplifier
104 current source
$I_q$ current of current source
Q1 transistor
S source terminal of field-effect transistor
D drain terminal of field-effect transistor
G gate terminal of field-effect transistor
105 DC voltage source
VDD DC voltage provided by DC voltage source
$I_g$ bias current provided to output of gain amplifier
VA bias voltage provided to output of gain amplifier
406 transmitter
407 electro-optical modulator
508 system
509 signal source

The invention claimed is:

1. Amplifier circuit for amplifying a signal, wherein the amplifier circuit comprises:
   a gain amplifier with a gain amplifier output;
   a distributed amplifier coupled to the gain amplifier output;
   a resistor terminating an input of the distributor amplifier; and a current source electrically connected in parallel to the resistor, wherein the current source has an impedance that is higher than the impedance of the resistor.

2. The amplifier circuit according to claim 1, wherein the resistor is configured to set bandwidth and gain of the amplifier circuit.

3. The amplifier circuit according to claim 1, wherein the impedance of the current source is dimensioned such that it does not substantially affect gain and bandwidth of the amplifier circuit.

4. The amplifier circuit according to claim 1, wherein the amplifier circuit is configured to be implemented in a Monolithic Microwave Integrated Circuit.

5. The amplifier circuit according to claim 1, wherein a direct current (DC) voltage source electrically connected to the resistor that provides a bias current, a bias voltage to the gain amplifier output through the input of the distributed amplifier, and the current source is configured to set the bias voltage by setting the current flowing from the DC voltage source through the resistor.

6. The amplifier circuit according to claim 5, wherein the current source comprises a transistor configured to set the current flowing through the resistor.

7. The amplifier circuit according to claim 6, wherein the transistor is configured to set the current flowing from the DC voltage source through the resistor such that at least one third of the bias current flows through the resistor.

8. The amplifier circuit according to claim 6, wherein the transistor of the current source is a field-effect transistor, in particular a metal-oxide-semiconductor field-effect transistor, or a bipolar junction transistor.

9. The amplifier circuit according to claim 6, wherein the transistor of the current source is a field-effect transistor, the source terminal and the gate terminal of the field-effect transistor are electrically connected to a terminal of the resistor that is electrically connected to the input of the distributed amplifier, and the drain terminal is electrically connected to another terminal of the resistor, to which a DC voltage source can be electrically coupled.

10. The amplifier circuit according to claim 6, wherein the transistor of the current source is a bipolar junction transistor, the emitter terminal and the base terminal of the bipolar junction transistor are electrically connected to a terminal of the resistor that is electrically connected to the input of the distributed amplifier, and the collector terminal is electrically connected to another terminal of the resistor, to which a DC voltage source can be electrically connected.

11. Amplifier circuit for amplifying a signal, wherein the amplifier circuit comprises:
a gain amplifier with a gain amplifier output;
a distributed amplifier coupled to the gain amplifier output;
a resistor terminating an input of the distributor amplifier and configured to set bandwidth and gain of the amplifier circuit; and
a current source electrically connected in parallel to the resistor;
wherein a direct current (DC) voltage source electrically connected to the resistor that provides a bias current, a bias voltage to the gain amplifier output through the input of the distributed amplifier, and the current source is configured to set the bias voltage by setting the current flowing from the DC voltage source through the resistor.

12. The amplifier circuit according to claim 11, wherein the current source comprises a transistor configured to set the current flowing through the resistor.

13. The amplifier circuit according to claim 12, wherein the transistor is configured to set the current flowing from the DC voltage source through the resistor such that at least one third of the bias current flows through the resistor.

14. The amplifier circuit according to claim 12, wherein the transistor of the current source is a field-effect transistor, in particular a metal-oxide-semiconductor field-effect transistor, or a bipolar junction transistor.

15. The amplifier circuit according to claim 12, wherein the transistor of the current source is a field-effect transistor, the source terminal and the gate terminal of the field-effect transistor are electrically connected to a terminal of the resistor that is electrically connected to the input of the distributed amplifier, and the drain terminal is electrically connected to another terminal of the resistor, to which a DC voltage source can be electrically coupled.

16. The amplifier circuit according to claim 12, wherein the transistor of the current source is a bipolar junction transistor, the emitter terminal and the base terminal of the bipolar junction transistor are electrically connected to a terminal of the resistor that is electrically connected to the input of the distributed amplifier, and the collector terminal is electrically connected to another terminal of the resistor, to which a DC voltage source can be electrically connected.

* * * * *